(12) United States Patent
Hudson

(10) Patent No.: US 10,541,144 B2
(45) Date of Patent: Jan. 21, 2020

(54) SELF-ASSEMBLED MONOLAYERS AS AN ETCHANT IN ATOMIC LAYER ETCHING

(71) Applicant: Lam Research Corporation, Fremont, CA (US)

(72) Inventor: Eric Hudson, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 115 days.

(21) Appl. No.: 15/845,910

(22) Filed: Dec. 18, 2017

(65) Prior Publication Data

US 2019/0189462 A1    Jun. 20, 2019

(51) Int. Cl.
*H01L 21/31*     (2006.01)
*H01L 21/311*    (2006.01)
*H01L 21/265*    (2006.01)

(52) U.S. Cl.
CPC ...... *H01L 21/31116* (2013.01); *H01L 21/265* (2013.01)

(58) Field of Classification Search
None
See application file for complete search history.

(56) References Cited

U.S. PATENT DOCUMENTS

| | | | |
|---|---|---|---|
| 9,378,971 B1 | 6/2016 | Briggs et al. | |
| 9,607,837 B1 | 3/2017 | Namba | |
| 9,627,221 B1 | 4/2017 | Zaitsu et al. | |
| 2008/0274334 A1 | 11/2008 | Sekiya et al. | |
| 2010/0330787 A1* | 12/2010 | Sferlazzo | H01L 21/2236 438/514 |
| 2016/0211147 A1 | 7/2016 | Fukazawa | |
| 2016/0268141 A1 | 9/2016 | Hudson | |
| 2017/0186621 A1* | 6/2017 | Zaitsu | H01J 37/32146 |

OTHER PUBLICATIONS

International Search Report from International Application No. PCT/US2-18/-63145 dated Mar. 15, 2019.
Written Opinion from International Application No. PCT/US2-18/-63145 dated Mar. 15, 2019.

* cited by examiner

*Primary Examiner* — Bradley Smith
(74) *Attorney, Agent, or Firm* — Beyer Law Group LLP

(57) ABSTRACT

A method for etching features into a silicon containing layer comprising performing a plurality of cycles in a plasma processing chamber is provided. Each cycle comprises a deposition phase and an activation phase. The deposition phase comprises flowing a precursor into the plasma processing chamber to form a self-limiting monolayer, wherein the precursor comprises a head group component and a tail group component, wherein the tail group component comprises fluorine and carbon, and stopping the flow of the precursor into the plasma processing chamber. The activation phase comprises flowing an activation gas comprising an ion bombardment gas, into the plasma processing chamber, creating a plasma from the activation gas, providing an activation bias to cause ion bombardment of the self-limiting monolayer, wherein the ion bombardment activates the fluorine from the tail group component to etch the silicon containing layer, and stopping the flow of the activation gas.

19 Claims, 7 Drawing Sheets

SELF-ASSEMBLED MONOLAYERS AS AN ETCHANT IN ATOMIC LAYER ETCHING

BACKGROUND

Field

The present disclosure relates to a method of forming semiconductor devices on a semiconductor wafer. More specifically, the present disclosure relates to etching a silicon containing layer.

In forming semiconductor devices, a silicon containing layer may be etched in order to form semiconductor devices, such as memory devices.

SUMMARY

To achieve the foregoing and in accordance with the purpose of the present disclosure, a method for etching features into a silicon containing layer comprising performing a plurality of cycles in a plasma processing chamber is provided. Each cycle comprises a deposition phase and an activation phase. The deposition phase comprises flowing a precursor into the plasma processing chamber to form a self-limiting monolayer, wherein the precursor comprises a head group component and a tail group component, wherein the head group component bonds to the silicon containing layer, and wherein the tail group component comprises fluorine and carbon, and stopping the flow of the precursor into the plasma processing chamber. The activation phase comprises flowing an activation gas comprising an ion bombardment gas, into the plasma processing chamber, creating a plasma in the plasma processing chamber from the activation gas, providing an activation bias in the plasma processing chamber to cause ion bombardment of the self-limiting monolayer, wherein the ion bombardment activates the fluorine from the tail group component to etch the silicon containing layer, and stopping the flow of the activation gas into the plasma processing chamber.

In another manifestation, a method for etching features into a silicon containing layer comprising performing a plurality of cycles in a plasma processing chamber is provided. Each cycle comprises a deposition phase and an activation phase. The deposition phase comprises flowing a precursor into the plasma processing chamber to form a self-limiting monolayer, wherein the precursor comprises a halogen containing component, which is at least one of an interhalogen or a molecule comprising a halogen component and a nonhalogen component, and stopping the flow of the precursor into the plasma processing chamber. The activation phase comprises flowing an activation gas comprising an ion bombardment gas, into the plasma processing chamber, creating a plasma in the plasma processing chamber from the activation gas, providing an activation bias in the plasma processing chamber to cause ion bombardment of the self-limiting monolayer, wherein the ion bombardment activates the halogen containing component to etch the silicon layer, and stopping the flow of the activation gas into the plasma processing chamber.

These and other features of the present disclosure will be described in more details below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
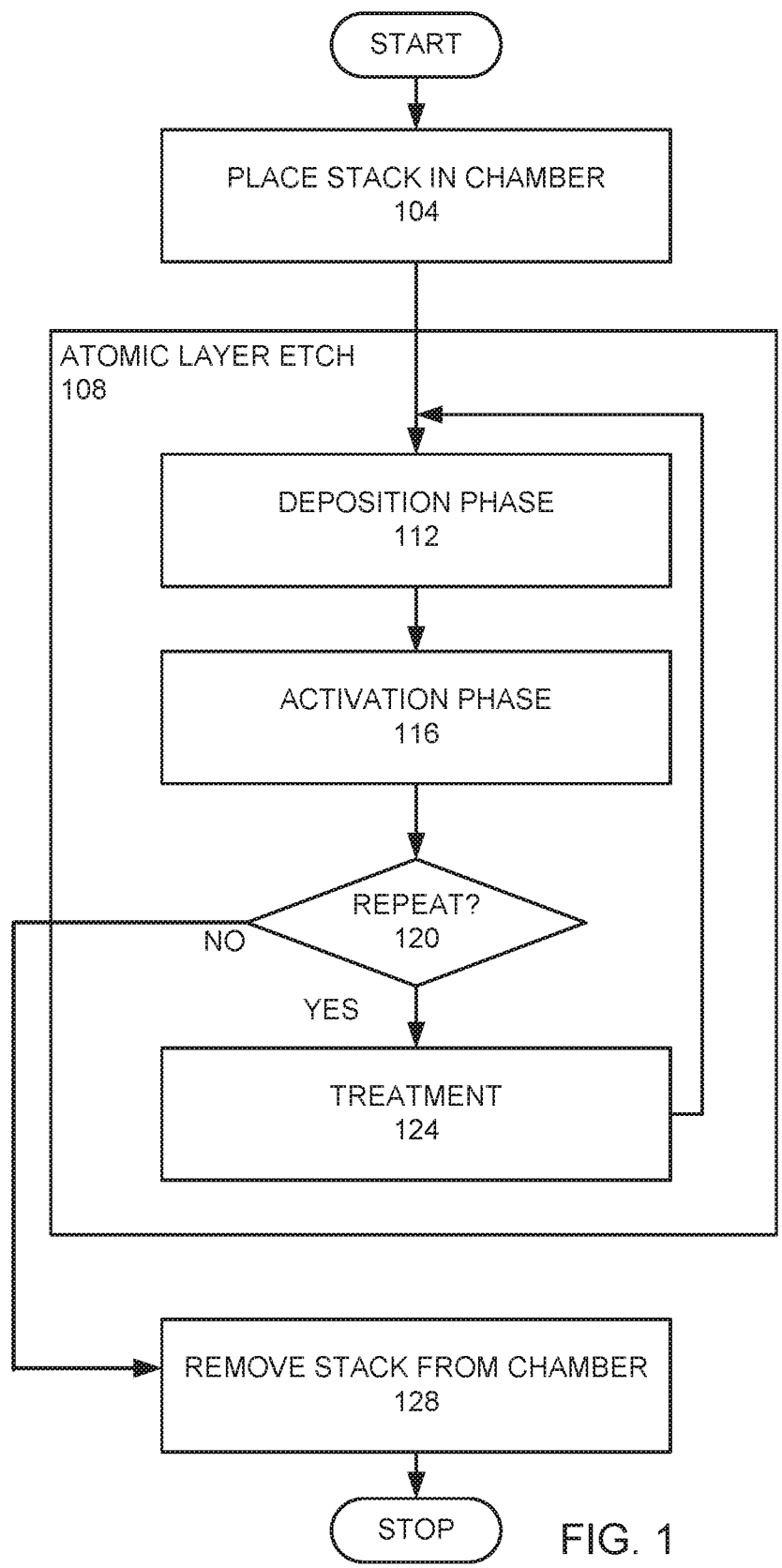
FIG. 1 is a high level flow chart of an embodiment.

FIG. 1 is a high level flow chart of an embodiment. In this embodiment, a stack is placed in an etch chamber (step 104). Preferably, the stack comprises a substrate located under a silicon containing layer, which, in turn, is located under a mask. The silicon containing layer is etched using an atomic layer etch (ALE) (step 108). Such an etch involves a cyclical process having multiple cycles. In each cycle, there is a deposition phase (step 112) and an activation phase (step 116). During the deposition phase, a self-limiting monolayer is deposited to form a deposited layer. During the activation phase, the deposited layer is activated, which cause the self-limiting monolayer to be activated to etch the silicon containing layer. A determination is made whether to repeat the cycle (step 120). If the cycle is repeated, a treatment phase is applied to the silicon containing layer before the deposition phase is repeated (step 124). After a sufficient number of cycles are completed, the stack is removed from the etch chamber (step 128).

EXAMPLE

Figure 3:
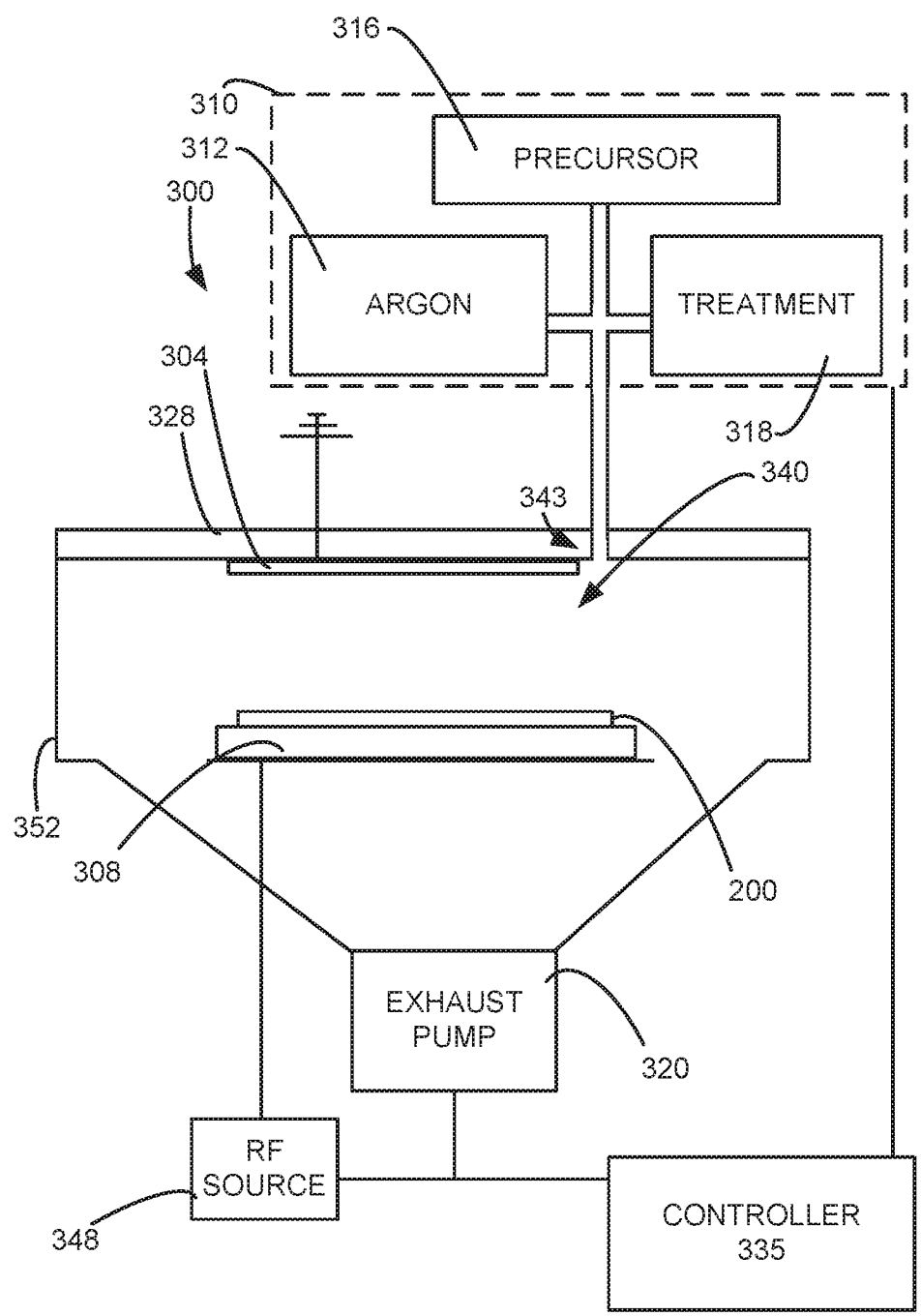
FIG. 3 is a schematic view of a plasma processing chamber that may be used in an embodiment.

FIG. 3 is a schematic view of a plasma processing chamber 300 that may be used for one or more of the following steps. The plasma processing chamber 300 comprises an upper electrode 304, a lower electrode 308, a gas source 310, and an exhaust pump 320. Within plasma processing chamber 300, the stack is positioned upon the lower electrode 308. The lower electrode 308 incorporates a suitable substrate chucking mechanism (e.g., electrostatic, mechanical clamping, or the like) for holding the stack 200. The reactor top 328 incorporates the upper electrode 304 disposed immediately opposite the lower electrode 308. The upper electrode 304 and lower electrode 308 define the confined plasma volume 340. Gas is supplied to the confined plasma volume 340 through a gas inlet 343 by the gas source 310 and is exhausted from the confined plasma volume 340 through an exhaust port by the exhaust pump 320. Besides helping to exhaust the gas, the exhaust pump 320 helps to regulate pressure. In this embodiment, the gas source 310 comprises an argon gas source 312, a precursor source 316, and a treatment gas source 318. The gas source 310 may further comprise other gas sources. An RF source 348 is electrically connected to the lower electrode 308. Chamber walls 352 surround the upper electrode 304, and the lower electrode 308. Different combinations of connecting RF power to the electrode are possible. In a preferred embodiment, the 27 MHz, 60 MHz and 2 MHz power sources make up the RF source 348 connected to the lower electrode 308, and the upper electrode 304 is grounded. A controller 335 is controllably connected to the RF source 348, exhaust pump 320, and the gas source 310. Preferably, the plasma processing chamber 300 is a CCP (capacitive coupled plasma) reactor, as shown. In other embodiments, an ICP (inductive coupled plasma) reactor or other sources like surface wave, microwave, or electron cyclotron resonance (ECR) may be used.

Figure 4:
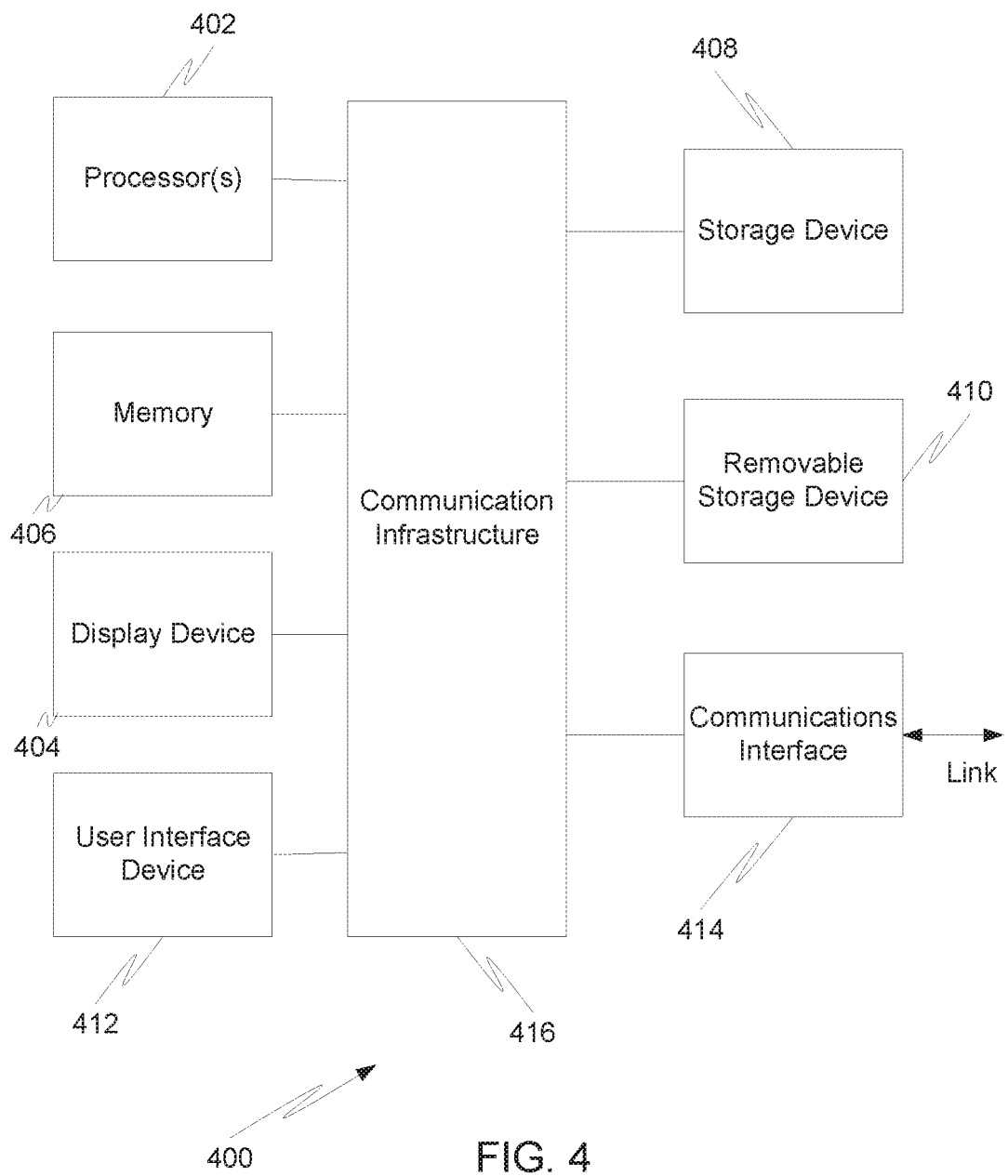
FIG. 4 is a schematic view of a computer system that may be used in practicing an embodiment.

FIG. 4 is a high level block diagram showing a computer system 400, which is suitable for implementing a controller 335 used in embodiments. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments may execute solely upon the processors or may execute over a network such as the Internet, in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2A:
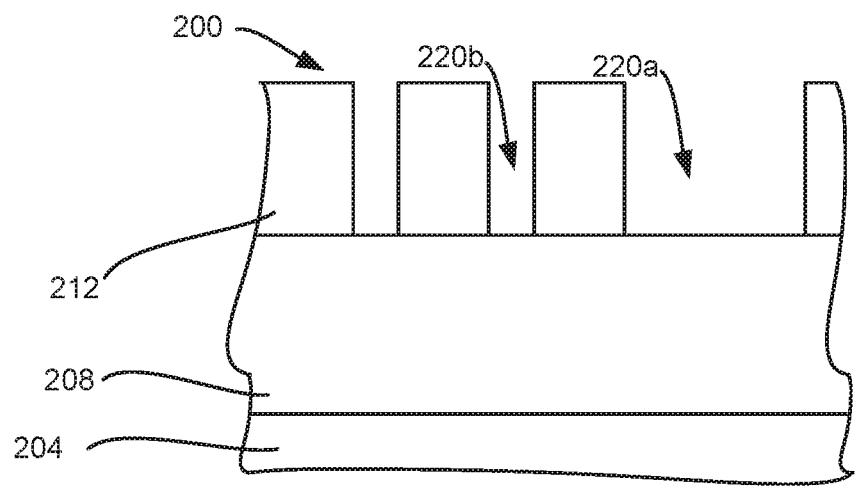
FIGS. 2A-D are schematic cross-sectional views of a stack processed according to an embodiment.

In a preferred embodiment, a stack is placed in an etch chamber (step 104). FIG. 2A is a schematic cross-sectional view of a stack 200 with a substrate 204 with a silicon containing layer 208 disposed below a patterned mask 212. In this example, one or more layers (not shown) may be disposed between the substrate 204 and the silicon containing layer 208, or between the silicon containing layer 208 and the patterned mask 212. In some embodiments, the silicon containing layer 208 is the substrate 204. In this example, the patterned mask 212 is a photoresist mask, and the silicon containing layer 208 is a silicon oxide based layer. In this example, mask pattern features 220 have been formed in the patterned mask 212. In some embodiments, the mask pattern features 220 are formed before the stack 200 is placed in the etch chamber. In other embodiments, the mask pattern features 220 are formed while the stack 200 is in the etch chamber. As shown, some mask pattern features 220a may be wider than other mask pattern features 220b. In this example, one mask pattern feature 220a is several times wider than another mask pattern feature 220b.

Figure 2B:
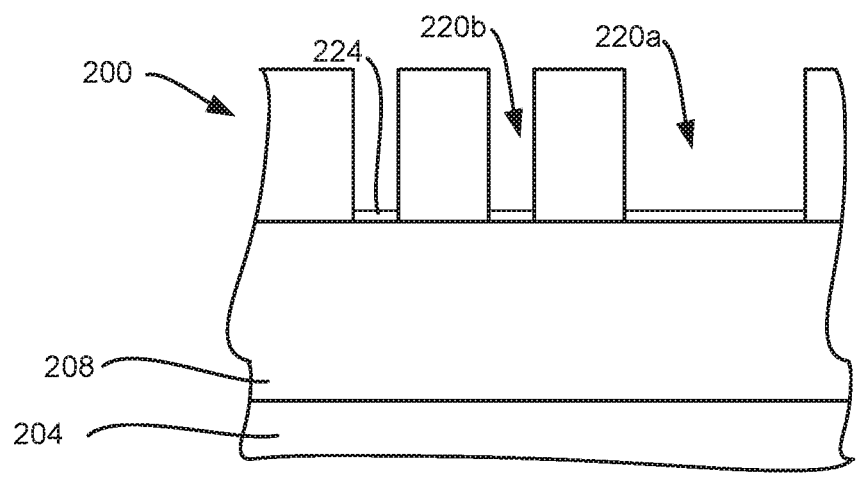
Figure 5:
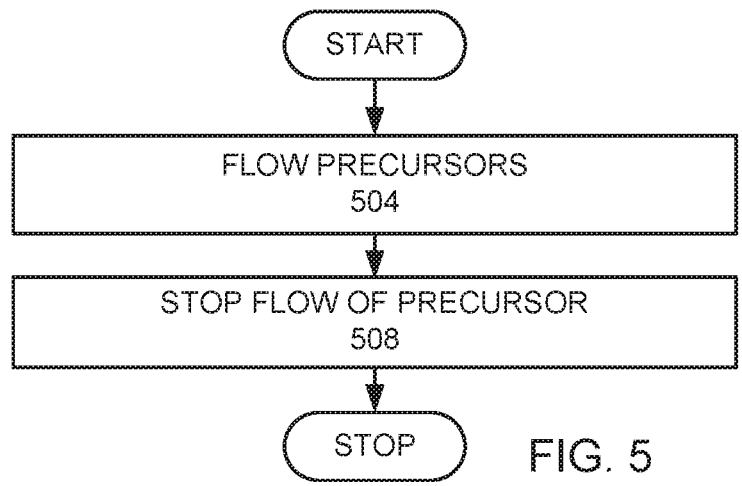
FIG. 5 is a more detailed flow chart of the deposition phase according to an embodiment.

After the stack 200 has been placed into the plasma processing chamber 300, the silicon containing layer 208 is etched with an ALE (step 108). The ALE is a cyclical process and has one or more cycles. Each cycle has a deposition phase (step 112) and an activation phase (step 116). During the deposition phase, a self-limiting monolayer is deposited to form a deposited layer (step 112). FIG. 5 is a more detailed flow chart of the deposition phase. A precursor is flowed into the plasma processing chamber 300 (step 504). In this example, the precursor is a polymer chain with a head including a molecule that bonds to silicon, and a fluorocarbon containing tail including fluorine and carbon. In this embodiment, the precursor is trifluoroacetyl chloride. After about 1-5 seconds, the flow of the precursor is stopped (step 508). FIG. 2B is a schematic cross-sectional view of the stack 200 after the self-limiting monolayer 224 has been deposited. In this embodiment, the precursor only forms a self-limiting monolayer that is deposited on the silicon containing surface of the silicon containing layer 208; the precursor does not form a self-limiting monolayer on top portions of the patterned mask 212.

Figure 2C:
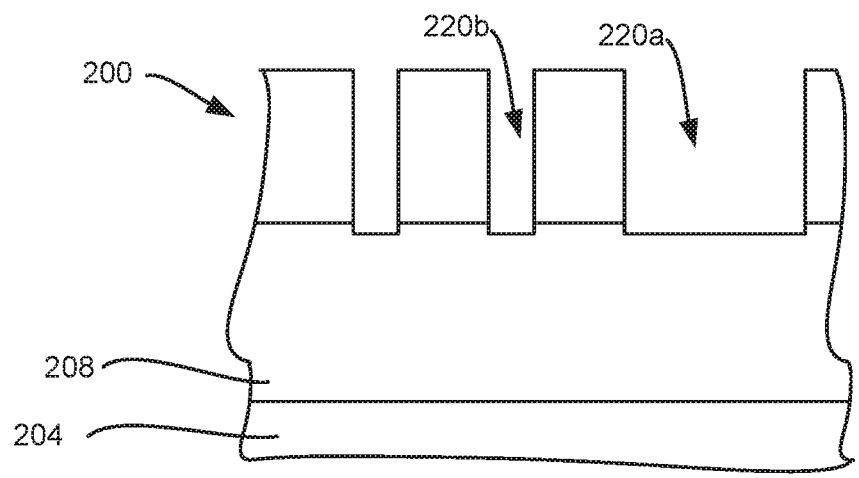
Figure 6:
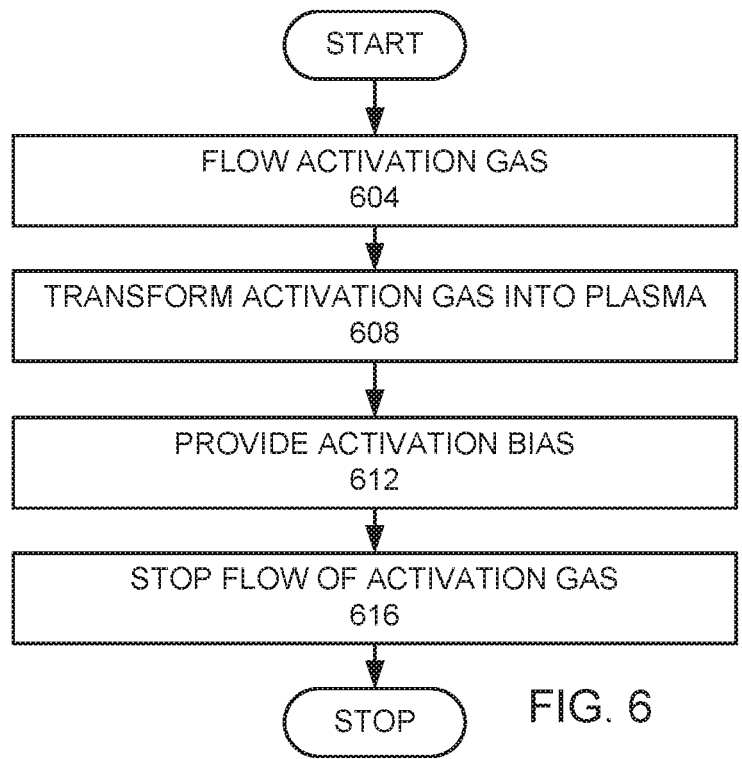
FIG. 6 is a more detailed flow chart of the activation phase according to an embodiment.

The activation phase then follows the deposition phase. During the activated phase, the deposited layer is activated (step 116). FIG. 6 is a more detailed flow chart of the activation phase. An activation gas is flowed into the plasma processing chamber 300 (step 604). In this example, the activation gas is 300 sccm Ar, which is an ion bombardment gas. A chamber pressure of 10 mTorr and a wafer temperature of 80° C. is provided. The activation gas is transformed into a plasma (step 608). In this embodiment, 30-200 Watts of RF power is provided at 2 MHz and 30-300 Watts of RF power is provided at 60 MHz, thereby transforming the activation gas into a plasma. An activation bias ranging from −20V to −400V volts is provided (step 612). The activation bias is an electrical potential on the substrate resulting from the combination of RF power and plasma, which causes ions to be accelerated from the plasma to the substrate. After 1-5 seconds, the flow of the activation gas is stopped (step 616). FIG. 2C is a schematic cross-sectional view of the stack 200 after the deposited layer (i.e., the self-limiting monolayer 224) has been activated. The fluorine in the self-limiting monolayer 224 is activated, thereby etching the silicon containing layer 208. The deposited layer is completely removed and some of the silicon containing layer 208 is etched.

Figure 7:
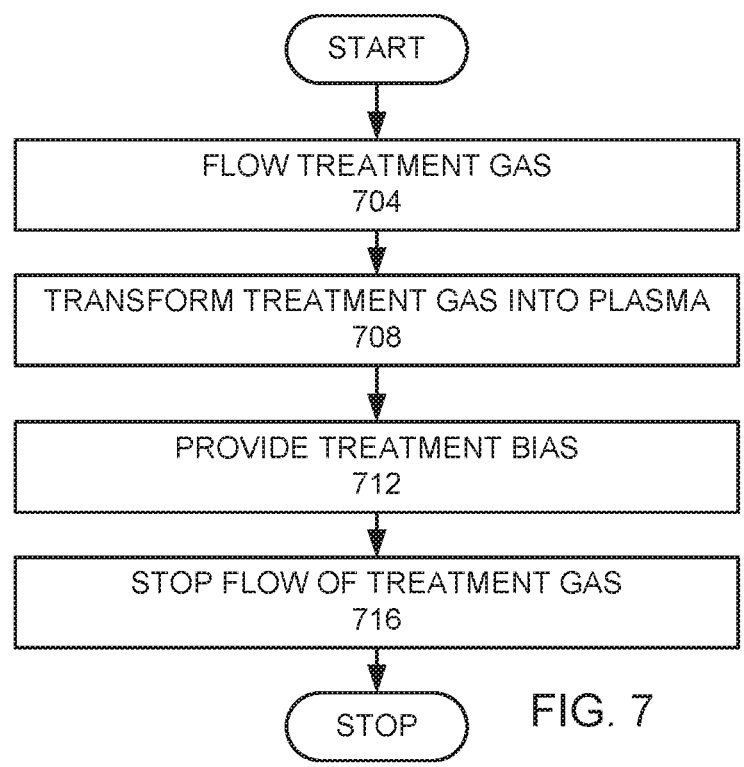
FIG. 7 is a flow chart of treatment phase according to an embodiment.

The ALE (step 108) may then be repeated (step 120) as needed to increment the progress of the etch. In this embodiment, if the ALE is to be repeated, the silicon containing layer 208 is subjected to a treatment phase (step 124). FIG. 7 is a more detailed flow chart of the treatment phase (step 124). A treatment gas is flowed into the plasma processing chamber 300 (step 704). In this embodiment, the treatment gas is $H_2$. A chamber pressure of 50 mTorr and a wafer temperature of 80° C. are provided. The treatment gas is transformed into a plasma (step 708). In this embodiment, 0-50 Watts of RF power is provided at 2 MHz and 10-100 Watts of RF power is provided at 60 MHz, thereby transforming the treatment gas into a plasma. A treatment bias ranging from −20 V to −150 V is provided (step 712). After 1-5 seconds, the flow of the treatment gas is stopped (step 716).

Figure 2D:
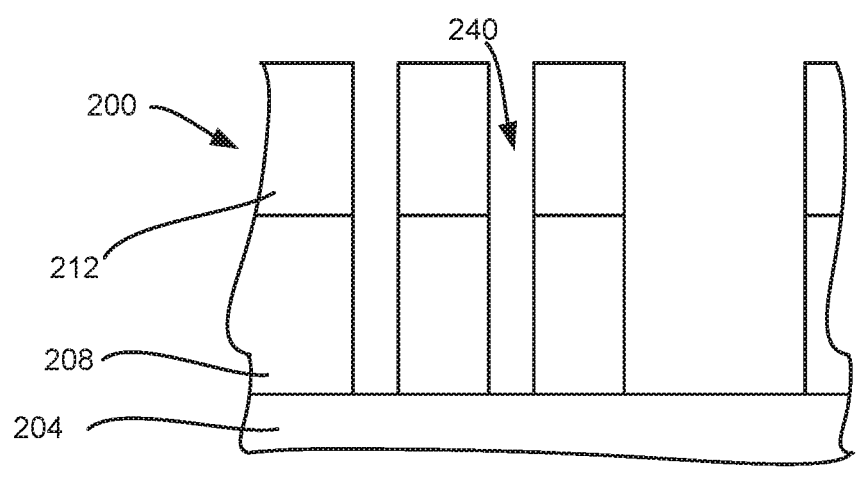

Preferably, the ALE (step 108) is repeated from five (5) to five hundred (500) times. After the ALE is performed for a plurality of cycles, the etch is completed. FIG. 2D is a schematic cross-sectional view of a stack 200 after etching of the features 240 is completed. The stack 200 may be subjected to additional processing before the stack 200 is removed from the plasma processing chamber 300.

This embodiment enables reduced etch depth loading as compared to conventional etch or conventional ALE. The use of a self-assembled monolayer (SAM) precursor molecule with high content of fluorine is optimal for the etching of silicon oxide, silicon nitride, and related materials. Other embodiments may use other key mask materials, such as spin-on organic mask layer and α-C, amorphous carbon (ACL).

For other embodiments, providing a silicon oxide etch, a precursor uses acyl chloride functionality for the head group component, and fluorocarbon functionality for the tail group component. For example, trifluoroacetyl chloride, CF3-COCl, is a suitable molecule. The acyl chloride group readily reacts with surface hydroxyl groups on silicon dioxide, and is also likely to react with ion-induced surface radicals. If the latter reaction is not sufficient, the treatment phase may provide an $H_2$ plasma treatment to promote surface silanol (—Si—OH) formation. In another embodiment, the treatment phase may be a $H_2O$ vapor based process to convert surface radicals to surface silanol. In various embodiments, the treatment phase conditions the silicon containing layer to increase the formation of the self-limiting monolayer during the deposition phase. In some embodiments, the treatment phase is selective in that the phase selectively conditions the silicon containing layer to selectively increase a formation of the self-limiting monolayer during the deposition phase. In some embodiments, the treatment phase selectively increases a formation of a self-limiting monolayer on horizontal surfaces with respect to vertical surfaces.

Other head group components could include alcohols, amines, amino-silanes, or organo-silanes. Other tail groups could include different —CxFy composition, possibly including longer, branched, and/or unsaturated groups. For example, pentafluoropropionyl chloride, CF3-CF2-COCl, and similarly with longer perfluorinated chains are known compounds. Tail groups might also include other elements including H, N, Cl, and Br.

Many etch applications have a tight requirement for etch depth loading, specifically the requirement to etch different features at a uniform rate. Specifically, this means patterned features with different shapes and/or CD's (critical dimensions). In some cases, the requirement extends from CD's<15 nm to CD's>100 nm. ALE can improve performance on etch depth loading.

Various embodiments use self-assembled monolayers (SAM's), which contain halogen atoms as precursor for ALE. SAM's are a class of chemical compounds designed to spontaneously adsorb on a target surface, creating single-layer coverage. SAM's are generally organic molecules but some embodiments provide precursors with no organic content. SAM precursors are often delivered in the liquid phase but, in some embodiments, the precursors are only delivered as vapor. In some embodiments, the deposition phase is plasmaless. The plasmaless deposition facilitates the use of some of the precursors described above, which are able to form SAM's in a plasmaless deposition.

In various embodiments, the precursor is introduced in a dose step as specially tailored molecules without plasma dissociation. These are stable molecules at typical etch temperatures. Activation of the surface is achieved by conventional inert plasma ion bombardment. The activation gas is an ion bombardment gas, which when formed into a plasma, forms chemically inert ions, which bombard the surface to provide kinetic energy to the surface. The precursor is reactive enough at moderate temperatures (T<120° C.) to adsorb on the surface to be etched, but has much lower reactivity than plasma-based radical species. Optimization of the precursor properties is important in order to achieve (1) adequate surface reactivity at desired surface temperatures (typically <120° C.) and (2) overall chemical composition sufficient to provide effective etchants (e.g. appropriate ratio of F to C for oxide etch). The effectiveness of surface adsorption is improved by the cyclic nature of the ALE process—the ion bombardment activation step typically creates active surface sites on the etch front which can bind with precursor molecules in the subsequent dose step. This preferentially promotes adsorption on horizontal surfaces, which have a much higher degree of ion modification. In this way, ion-assisted adsorption reduces unwanted adsorption on the feature sidewalls.

The lower reactivity in various embodiments has implications for aspect ratio dependent transport. There is much lower surface loss rate compared to radicals, and this surface loss is limited to single monolayer coverage. Specifically, the precursor has zero or very low rate of surface reactions (this is a requirement for any stable molecule which can be stored in container). This type of transport is analogous to the superior precursor transport well-known for thermal atomic layer deposition (ALD) as compared to plasma-assisted ALD. In addition, the likelihood of etching during dose is much lower due to the absence of plasma ion bombardment during these steps. For these reasons, the embodiments greatly improve upon two problems which could contribute to depth loading: aspect ratio-dependent transport in dose/dep steps; and etching during the dose/dep steps.

In various embodiments, tail groups can be tailored for different materials. For etching nitride, it may be helpful to include H, e.g., tail group could be —CH2-CF3. For etching silicon, it may be useful to include Cl or Br, e.g., tail group could be —CCl3. Note that acyl chlorides have some ability to attach to nitride and silicon surfaces. In other embodiments, the precursor may use halogen-rich compounds, with little or no carbon. Such embodiments would use precursors comprising a halogen containing component, which is at least one of an interhalogen or a molecule comprising a halogen component and a nonhalogen component. Examples of a halogen containing component comprising a halogen component and a nonhalogen component are $NF_3$, $BF_3$, and $PF_3$. For a silicon oxide etch, fluorine interhalogens may have the ability to react with target surfaces, in absence of plasma, to provide F surface adsorption. This reaction is potentially self-limiting. This could be useful for a silicon oxide etch, though the lack of carbon may restrict etch capability or require additional processing gases/steps. Examples of interhalogens include $ClF_3$, $IF_5$, $IF_7$, BrF3, and $IF_6$. Similarly, interhalogen precursors with Cl or Br could be used to provide Cl or Br surface adsorption to promote Si etch. Examples of such interhalogen precursors include ICl, $ICl_3$, IBr, BrCl, $Br_2$, $BrF_3$, and $BrF_5$.

In various embodiments, the precursors are self-limiting in order to form self-limiting monolayers. The use of self-limiting precursors allows for increased control of the deposition. Such increased control of the deposition allows for increased control of the uniformity of the etch and low depth loading of the etch. If the precursor is not self-limiting, then the precursor may be non-uniform, which would result in a non-uniform etch. In addition, lower height to width aspect ratio features would etch faster than higher aspect ratio features. In addition, a self-limiting precursor may selectively deposit on the silicon containing material with respect to the mask material, allowing for a more selective etch. In addition, a self-limiting precursor may selectively deposit on horizontal surfaces of the silicon containing layer with respect to vertical surfaces of the silicon containing layer, allowing the horizontal surfaces to be selectively etched with respect to the vertical surfaces. In other embodiments, precursors may selectively deposit on vertical surfaces with respect to horizontal surfaces in order to selectively etch vertical surfaces with respect to horizontal surfaces.

An advantage of an embodiment is that it avoids in-feature transport problems associated with plasma-based dose/dep steps. It also avoids unwanted etch during dose/dep steps, by removing plasma and using less reactive species (stable molecules vs radicals). This is believed to improve etch depth loading. Embodiments may be implemented in a conventional etch reactor, with modifications as needed to deliver and purge the vapor precursor. This compatibility is an advantage, as it makes it fairly easy to preserve the benefits of an existing etch reactor, while improving etch depth performance. By comparison, if liquid phase SAM were used for similar purposes, the substrate would have to be transferred back and forth between wet reactor to plasma reactor to achieve the cyclic ALE process.

In some embodiments, the silicon containing layer is a silicon oxide layer. In such embodiments, the precursor has a fluorine containing tail. Preferably, the precursor has a fluorine and carbon containing tail. In other embodiments, the silicon containing layer is a silicon layer. In such embodiments, the precursor has a halogen containing tail. More preferably, the precursor has a halogen and carbon containing tail.

In one embodiment, the activation bias has a magnitude that is below a bias needed to cause sputtering of the silicon containing layer but equal to or above a bias needed to activate the self-limiting monolayer. For example, for silicon oxide, the activation bias has a magnitude below 80 volts and above 30 volts. Activation of the precursor is provided by physical bombardment energy. Since the activation energy is less than the energy needed for sputtering, the amount of etching is dependent only on the self-limiting monolayer. As a result, horizontal surfaces may be selectively etched with respect to vertical surfaces, and depth loading may be improved. In other embodiments, different activation biases may be used. In such embodiments, the activation bias may have a magnitude greater than 80 volts. In other embodiments, the activation bias may be pulsed by using RF pulsing. In an embodiment, the pulsed activation bias may provide a bias magnitude greater than 30 volts. In some embodiments, the activation bias provided by pulsing has a maximum magnitude between 30 volts and 800 volts. In some embodiments, the activation bias provided by RF pulsing includes a low bias state with a magnitude between 0 to 200 volts and a high bias state between 30 to 1000 volts. In some embodiments, the activation gas comprises an inert bombardment gas and a reactive gas.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for etching features into a silicon containing layer, comprising performing a plurality of cycles in a plasma processing chamber, wherein each cycle comprises:
   a treatment phase to condition the silicon containing layer;
   a deposition phase, comprising:
      flowing a precursor into the plasma processing chamber to form a self-limiting monolayer, wherein the precursor comprises a head group component and a tail group component, wherein the head group component bonds to the silicon containing layer, and wherein the tail group component comprises fluorine and carbon, wherein the treatment phase increases formation of the self-limiting monolayer; and
      stopping the flow of the precursor into the plasma processing chamber; and
   an activation phase, comprising:
      flowing an activation gas comprising an ion bombardment gas, into the plasma processing chamber;
      creating a plasma in the plasma processing chamber from the activation gas;
      providing an activation bias in the plasma processing chamber to cause ion bombardment of the self-limiting monolayer, wherein the ion bombardment activates the fluorine from the tail group component to etch the silicon containing layer; and
      stopping the flow of the activation gas into the plasma processing chamber.

2. The method, as recited in claim 1, wherein the silicon containing layer comprises silicon oxide or silicon nitride.

3. The method, as recited in claim 1, wherein the treatment phase is a selective treatment phase to selectively condition the silicon containing layer such that formation of the self-limiting monolayer is selectively increased during the deposition phase.

4. The method, as recited in claim 3, wherein the selective treatment phase selectively increases the formation of the self-limiting monolayer on horizontal surfaces with respect to vertical surfaces.

5. The method, as recited in claim 1, wherein the activation bias has a magnitude that is below a bias for causing sputtering of the silicon containing layer but equal to or above a bias for activating the self-limiting monolayer.

6. The method, as recited in claim 1, wherein the flowing the precursor into the plasma processing chamber flows the precursor as a vapor.

7. The method, as recited in claim 1, wherein the treatment phase comprises providing a $H_2O$ vapor or a $H_2$ plasma in the plasma processing chamber.

8. The method, as recited in claim 1, wherein the activation bias is pulsed.

9. A method for etching features into a silicon containing layer, comprising performing a plurality of cycles in a plasma processing chamber, wherein each cycle comprises:
   a deposition phase, wherein the deposition phase is plasmaless, comprising:
   flowing a precursor into the plasma processing chamber to form a self-limiting monolayer, wherein the precursor comprises a head group component and a tail group component, wherein the head group component bonds to the silicon containing layer, and wherein the tail group component comprises fluorine and carbon; and
   stopping the flow of the precursor into the plasma processing chamber; and
   an activation phase, comprising:
   flowing an activation gas comprising an ion bombardment gas, into the plasma processing chamber;
   creating a plasma in the plasma processing chamber from the activation gas;
   providing an activation bias in the plasma processing chamber to cause ion bombardment of the self-limiting monolayer, wherein the ion bombardment activates the fluorine from the tail group component to etch the silicon containing layer; and
   stopping the flow of the activation gas into the plasma processing chamber.

10. A method for etching features into a silicon containing layer, comprising performing a plurality of cycles in a plasma processing chamber, wherein each cycle comprises:
   a treatment phase to condition the silicon containing layer;
   a deposition phase, comprising:
   flowing a precursor into the plasma processing chamber to form a self-limiting monolayer, wherein the precursor comprises a halogen containing component, which is at least one of an interhalogen or a molecule comprising a halogen component and a nonhalogen component, wherein the treatment phase increases formation of the self-limiting monolayer; and
   stopping the flow of the precursor into the plasma processing chamber; and
   an activation phase, comprising:
   flowing an activation gas comprising an ion bombardment gas, into the plasma processing chamber;
   creating a plasma in the plasma processing chamber from the activation gas;
   providing an activation bias in the plasma processing chamber to cause ion bombardment of the self-limiting monolayer, wherein the ion bombardment activates the halogen containing component to etch the silicon containing layer; and
   stopping the flow of the activation gas into the plasma processing chamber.

11. The method, as recited in claim 10, wherein the silicon containing layer comprises silicon oxide or silicon nitride.

12. The method, as recited in claim 10, wherein the treatment phase is a selective treatment phase to selectively condition the silicon containing layer such that formation of the self-limiting monolayer is selectively increased during the deposition phase.

13. The method, as recited in claim 12, wherein the treatment phase selectively increases formation of the self-limiting monolayer on horizontal surfaces with respect to vertical surfaces.

14. The method, as recited in claim 10, wherein the activation bias has a magnitude that is below a bias for causing sputtering of the silicon containing layer but equal to or above a bias for activating the self-limiting monolayer.

15. The method, as recited in claim 10, wherein the flowing the precursor into the plasma processing chamber flows the precursor as a vapor.

16. The method, as recited in claim 10, wherein the treatment phase comprises providing a $H_2O$ vapor or a $H_2$ plasma in the plasma processing chamber.

17. The method, as recited in claim 10, wherein the precursor comprises at least one of $ClF_3$, $IF_5$, $IF_7$, $BrF3$, $IF_6$, ICl, $ICl_3$, IBr, BrCl, $Br_2$, $BrF_3$, $BrF_5$, $NF_3$, $BF_3$, or $PF_3$.

18. The method, as recited in claim 10, wherein the activation bias is pulsed.

19. A method for etching features into a silicon containing layer, comprising performing a plurality of cycles in a plasma processing chamber, wherein each cycle comprises:
   a deposition phase, wherein the deposition phase is plasmaless, comprising:
   flowing a precursor into the plasma processing chamber to form a self-limiting monolayer, wherein the precursor comprises a halogen containing component, which is at least one of an interhalogen or a molecule comprising a halogen component and a nonhalogen component; and
   stopping the flow of the precursor into the plasma processing chamber; and
   an activation phase, comprising:
   flowing an activation gas comprising an ion bombardment gas, into the plasma processing chamber;
   creating a plasma in the plasma processing chamber from the activation gas;
   providing an activation bias in the plasma processing chamber to cause ion bombardment of the self-limiting monolayer, wherein the ion bombardment activates the halogen containing component to etch the silicon containing layer; and
   stopping the flow of the activation gas into the plasma processing chamber.

* * * * *